US012688118B2

(12) United States Patent
Jain et al.

(10) Patent No.:  US 12,688,118 B2
(45) Date of Patent:      Jul. 21, 2026

(54) NOTIFICATIONS FOR AVOIDING THERMAL SHUTDOWN

(71) Applicant: Sandisk Technologies, Inc., Milpitas, CA (US)

(72) Inventors: Nitin Jain, San Jose, CA (US); Srikanth Peddayyavandla, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 379 days.

(21) Appl. No.: 18/359,144

(22) Filed: Jul. 26, 2023

(65) Prior Publication Data

US 2024/0231962 A1      Jul. 11, 2024

Related U.S. Application Data

(60) Provisional application No. 63/479,022, filed on Jan. 9, 2023.

(51) Int. Cl.
| | |
|---|---|
| *G06F 12/02* | (2006.01) |
| *G06F 9/54* | (2006.01) |
| *G11C 5/14* | (2006.01) |

(52) U.S. Cl.
CPC .......... *G06F 12/0246* (2013.01); *G06F 9/542* (2013.01); *G11C 5/14* (2013.01)

(58) Field of Classification Search
None
See application file for complete search history.

(56) References Cited

U.S. PATENT DOCUMENTS

| | | | | |
|---|---|---|---|---|
| 7,051,221 | B2 * | 5/2006 | Clabes | ................ G06F 9/30149 |
| | | | | 713/323 |
| 8,762,656 | B2 | 6/2014 | Confalonieri et al. | |
| 9,811,267 | B1 * | 11/2017 | Yang | ...................... G11C 16/26 |
| 10,331,377 | B2 | 6/2019 | Prabhu et al. | |
| 11,023,326 | B2 | 6/2021 | Morning-Smith et al. | |
| 11,169,583 | B2 * | 11/2021 | Karalnik | ............... G06F 1/3287 |
| 11,307,909 | B2 * | 4/2022 | Shin | ...................... G06F 9/5011 |
| 11,334,251 | B2 * | 5/2022 | Vaysman | .............. G06F 3/0658 |
| 11,422,825 | B2 | 8/2022 | Devegowda | |

(Continued)

FOREIGN PATENT DOCUMENTS

| | | | | | |
|---|---|---|---|---|---|
| JP | 2006221484 | A | * | 8/2006 | ............. G06F 11/30 |
| KR | 20210088706 | A | * | 7/2021 | ............. G06F 13/16 |

(Continued)

*Primary Examiner* — Charles E Anya
(74) *Attorney, Agent, or Firm* — Patterson + Sheridan, LLP

(57) ABSTRACT

The present disclosure generally relates to improved wait time notifications from SSDs to host systems. Rather than assuming on when to restart an SSD after an asynchronous event notification (AEN) is sent, issuing a cool-off wait time. When an SSD is overheating, an AEN is sent from the SSD. An AEN may either be a warning event or a critical event. Once the AEN is received, a host may issue a banner with a cool-off wait time. The cool-off wait time is a predetermined time that will begin if the SSD is not detected by host systems. A non-detectable SSD means that the SSD is in a thermal shut down mode, which is initiated by a PMIC. In the thermal shut down mode, the cool-off wait timer will begin at host side. After the time has elapsed the SSD can then be restarted either manually by user or automatically by host.

18 Claims, 6 Drawing Sheets

300

Read current SOC and NAND temperatures 302 → Calculate current temperature SOC and/or NAND temperature 304

Current Temperature >1st Temperature Threshold 308 —No→ Current Temperature > 2nd Temperature Threshold 312 —No→ Current Temperature > 3rd Temperature Threshold 316 —No→ End 320

Yes ↓ Light throttle 310

Yes ↓ Drive enters heavy throttle Send warning AEN to host with 1st cool-off wait time 314

Yes ↓ Drive sends critical AEN to host with 2nd cool-off wait time Drive enters thermal shutdown 318

(56) References Cited

U.S. PATENT DOCUMENTS

| | | | | |
|---|---|---|---|---|
| 11,442,531 B2 * | 9/2022 | Egan | .................... | G06F 1/3228 |
| 2011/0173474 A1 | 7/2011 | Salsbery et al. | | |
| 2014/0149638 A1 * | 5/2014 | Jain | .................... | G06F 12/0888 |
| | | | | 711/103 |
| 2014/0365714 A1 * | 12/2014 | Sweere | ................... | G06F 1/206 |
| | | | | 711/103 |
| 2016/0018994 A1 * | 1/2016 | Miyamoto | ............ | G06F 1/3275 |
| | | | | 711/103 |
| 2016/0041596 A1 * | 2/2016 | Alcantara | ............. | G06F 1/3268 |
| | | | | 713/320 |
| 2017/0315599 A1 | 11/2017 | Marripudi et al. | | |
| 2019/0129648 A1 * | 5/2019 | Prabhu | ................. | G06F 3/0679 |
| 2020/0201707 A1 | 6/2020 | Lee | | |
| 2020/0210207 A1 | 7/2020 | Trika | | |
| 2020/0411123 A1 * | 12/2020 | Blodgett | ............. | G06F 12/1458 |
| 2021/0081026 A1 | 3/2021 | Nakayama et al. | | |
| 2022/0301598 A1 * | 9/2022 | Eemani | .................... | G11C 7/04 |
| 2023/0221890 A1 * | 7/2023 | Anchi | ................. | G06F 11/3034 |
| | | | | 711/154 |

FOREIGN PATENT DOCUMENTS

| | | | | |
|---|---|---|---|---|
| KR | 102291912 B1 | 8/2021 | | |
| WO | WO-2011137380 A1 * | 11/2011 | .......... | G06F 11/3041 |

* cited by examiner

100

400

500

600

NOTIFICATIONS FOR AVOIDING THERMAL SHUTDOWN

CROSS-REFERENCE TO RELATED APPLICATIONS

This application claims benefit of U.S. provisional patent application Ser. No. 63/479,022, filed Jan. 9, 2023, which is herein incorporated by reference.

BACKGROUND OF THE DISCLOSURE

Field of the Disclosure

Embodiments of the present disclosure generally relate to improved wait time notification for solid state drive (SSD).

Description of the Related Art

Solid State drives (SSD) are equipped with sophisticated firmware schemes and hardware (HW) arrangements to prevent the SSD from getting overheated and damaged. Once the SSD's internal temperature (either or combination of NAND temperature and application-specific integrated circuit (ASIC) temperature) exceeds a pre-determined highest temperature threshold then power management integrated circuit (PMIC) is instructed to cut-off the power to all the rails. The power cut-off renders the device in a complete shutdown state. Before reaching a thermal shutdown state, the SSD may undergo one or more low performance states, generally known as thermal throttling or low-power states. Upon thermal shutdown of an SSD, neither host nor the user is aware when the SSD can be safely restarted. The problem is applicable to a scenario where the SSD is used as the primary drive (i.e., system boot up drive) and also where the SSD is used as a secondary drive. Neither the host nor the user know when normal functioning of the SSD can be expected.

Therefore, there is a need in the art for improved handling of SDD drive thermal shutdowns.

SUMMARY OF THE DISCLOSURE

The present disclosure generally relates to improved wait time notifications for SSDs. Rather than assuming on when to restart an SSD after an asynchronous event notification (AEN) is sent, issuing a cool-off wait time. When an SSD is overheating, an AEN is sent from the SSD to the host. An AEN may either be a warning event or a critical event. The AEN sent from the SSD would include a cool-off wait time value. Once the AEN is received, a host may issue a banner with the cool-off wait time. The cool-off wait time is a predetermined time that will begin if the SSD is not detected. A non-detectable SSD post the AEN would mean that the SSD is in a thermal shut down mode. In the thermal shut down mode, the cool-off wait timer will begin at host side. After the timer expires the SSD can then be restarted either manually by user or automatically by the host. In the case where the SSD is the primary drive, the user needs to make a decision to shutdown the system gracefully before the thermal shutdown occurs at the SSD.

In one embodiment, a data storage device comprises: a memory device; and a controller coupled to the memory device, wherein the controller is configured to: receive an indication that a temperature of the memory device has exceeded a temperature threshold; send a first asynchronous event notification (AEN) warning to a host device; and send a first cool-off wait time indication to the host device.

In another embodiment, a data storage device comprises: a memory device; and a controller coupled to the memory device, wherein the controller is configured to: receive an indication that the memory device has exceeded a temperature threshold; cause a cool-off notification to be issued; shut down memory device for a predetermined period of time; and receive instruction from a host device to power on the memory device after the predetermined period of time.

In another embodiment, a data storage device comprises: means to store data; and a controller coupled to the means to store data, wherein the controller is configured to: receive an indication that the means to store data has exceeded a temperature threshold; and either: cause a message to be displayed indicating a cool-off time for the means to store data; or send a message to a host device indicating the cool-off time for the means to store data.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to improved wait time notifications for SSDs. Rather than assuming on when to restart an SSD after an asynchronous event notification (AEN) is sent, issuing a cool-off wait time. When an SSD is overheating, an AEN is sent from the SSD to the host. An AEN may either be a warning event or a critical event. The AEN sent from the SSD would include a cool-off wait time value. Once the AEN is received, a host may issue a banner with a cool-off wait time. The cool-off wait time is a predetermined time that will begin if the SSD is not detected. A non-detectable SSD post the AEN would mean that the SSD is in a thermal shut down mode. In the thermal shut down mode, the cool-off wait timer will begin at host side. After the timer expires the SSD can then be restarted either manually by user or automatically by the host. In the case where the SSD is the primary drive, the user needs to make a decision to shutdown the system gracefully before the thermal shutdown occurs at the SSD.

Figure 1:
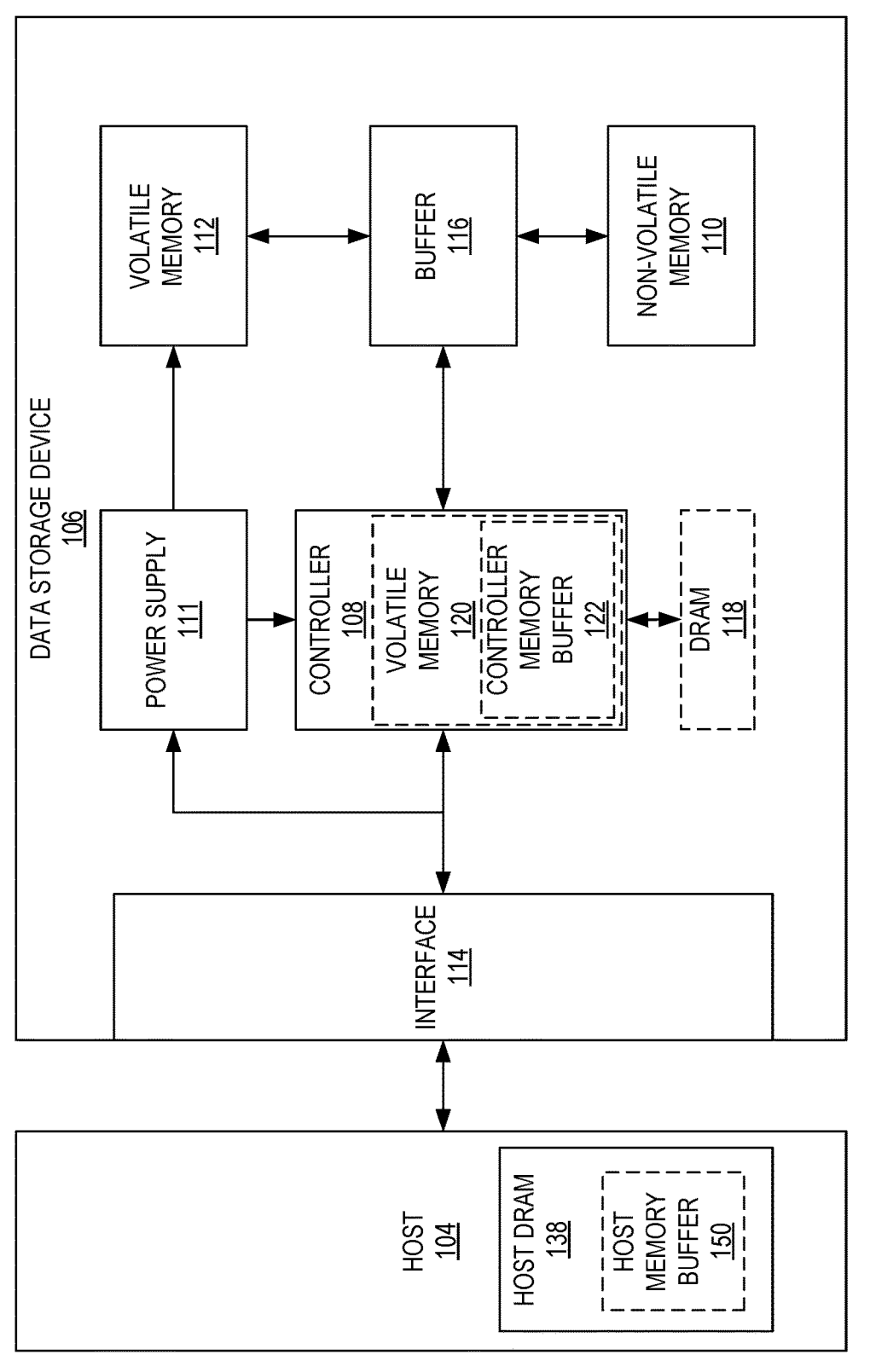
FIG. 1 is a schematic block diagram illustrating a storage system in which a data storage device may function as a storage device for a host device, according to certain embodiments.

FIG. 1 is a schematic block diagram illustrating a storage system 100 having a data storage device 106 that may function as a storage device for a host device 104, according to certain embodiments. For instance, the host device 104 may utilize a non-volatile memory (NVM) 110 included in data storage device 106 to store and retrieve data. The host device 104 comprises a host dynamic random access memory (DRAM) 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network-attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The host DRAM 138 may optionally include a host memory buffer (HMB) 150. The HMB 150 is a portion of the host DRAM 138 that is allocated to the data storage device 106 for exclusive use by a controller 108 of the data storage device 106. For example, the controller 108 may store mapping data, buffered commands, logical to physical (L2P) tables, metadata, and the like in the HMB 150. In other words, the HMB 150 may be used by the controller 108 to store data that would normally be stored in a volatile memory 112, a buffer 116, an internal memory of the controller 108, such as static random access memory (SRAM), and the like. In examples where the data storage device 106 does not include a DRAM (i.e., optional DRAM 118), the controller 108 may utilize the HMB 150 as the DRAM of the data storage device 106.

The data storage device 106 includes the controller 108, NVM 110, a power supply 111, volatile memory 112, the interface 114, a write buffer 116, and an optional DRAM 118. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106 or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered or plugged into a connector) to a motherboard of the host device 104.

Interface 114 may include one or both of a data bus for exchanging data with the host device 104 and a control bus for exchanging commands with the host device 104. Interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. Interface 114 (e.g., the data bus, the control bus, or both) is electrically connected to the controller 108, providing an electrical connection between the host device 104 and the controller 108, allowing data to be exchanged between the host device 104 and the controller 108. In some examples, the electrical connection of interface 114 may also permit the data storage device 106 to receive power from the host device 104. For example, as illustrated in FIG. 1, the power supply 111 may receive power from the host device 104 via interface 114.

The NVM 110 may include a plurality of memory devices or memory units. NVM 110 may be configured to store and/or retrieve data. For instance, a memory unit of NVM 110 may receive data and a message from controller 108 that instructs the memory unit to store the data. Similarly, the memory unit may receive a message from controller 108 that instructs the memory unit to retrieve data. In some examples, each of the memory units may be referred to as a die. In some examples, the NVM 110 may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit may include any type of non-volatile memory devices, such as flash memory devices, phase-change memory (PCM) devices, resistive random-access memory (ReRAM) devices, magneto-resistive random-access memory (MRAM) devices, ferroelectric random-access memory (F-RAM), holographic memory devices, and any other type of non-volatile memory devices.

The NVM 110 may comprise a plurality of flash memory devices or memory units. NVM Flash memory devices may include NAND or NOR-based flash memory devices and may store data based on a charge contained in a floating gate of a transistor for each flash memory cell. In NVM flash memory devices, the flash memory device may be divided into a plurality of dies, where each die of the plurality of dies includes a plurality of physical or logical blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The power supply 111 may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, super-capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The volatile memory 112 may be used by controller 108 to store information. Volatile memory 112 may include one or more volatile memory devices. In some examples, controller 108 may use volatile memory 112 as a cache. For instance, controller 108 may store cached information in volatile memory 112 until the cached information is written to the NVM 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)). Likewise, the optional DRAM 118 may be utilized to store mapping data, buffered commands, logical to physical (L2P) tables, metadata, cached data, and the like in the optional DRAM 118. In some examples, the data storage device 106 does not include the optional DRAM 118, such that the data storage device 106 is DRAM-less. In other examples, the data storage device 106 includes the optional DRAM 118.

Controller 108 may manage one or more operations of the data storage device 106. For instance, controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. Controller 108 may determine at least one operational characteristic of the storage system 100 and store at least one operational characteristic in the NVM 110. In some embodiments, when the data storage device 106 receives a write command from the host device 104, the controller 108 temporarily stores the data associated with the write command in the internal memory or write buffer 116 before sending the data to the NVM 110.

The controller 108 may include an optional second volatile memory 120. The optional second volatile memory 120 may be similar to the volatile memory 112. For example, the optional second volatile memory 120 may be SRAM. The controller 108 may allocate a portion of the optional second volatile memory to the host device 104 as controller memory buffer (CMB) 122. The CMB 122 may be accessed directly by the host device 104. For example, rather than maintaining one or more submission queues in the host device 104, the host device 104 may utilize the CMB 122 to store the one or more submission queues normally maintained in the host device 104. In other words, the host device 104 may generate commands and store the generated commands, with or without the associated data, in the CMB 122, where the controller 108 accesses the CMB 122 in order to retrieve the stored generated commands and/or associated data.

Figure 2:
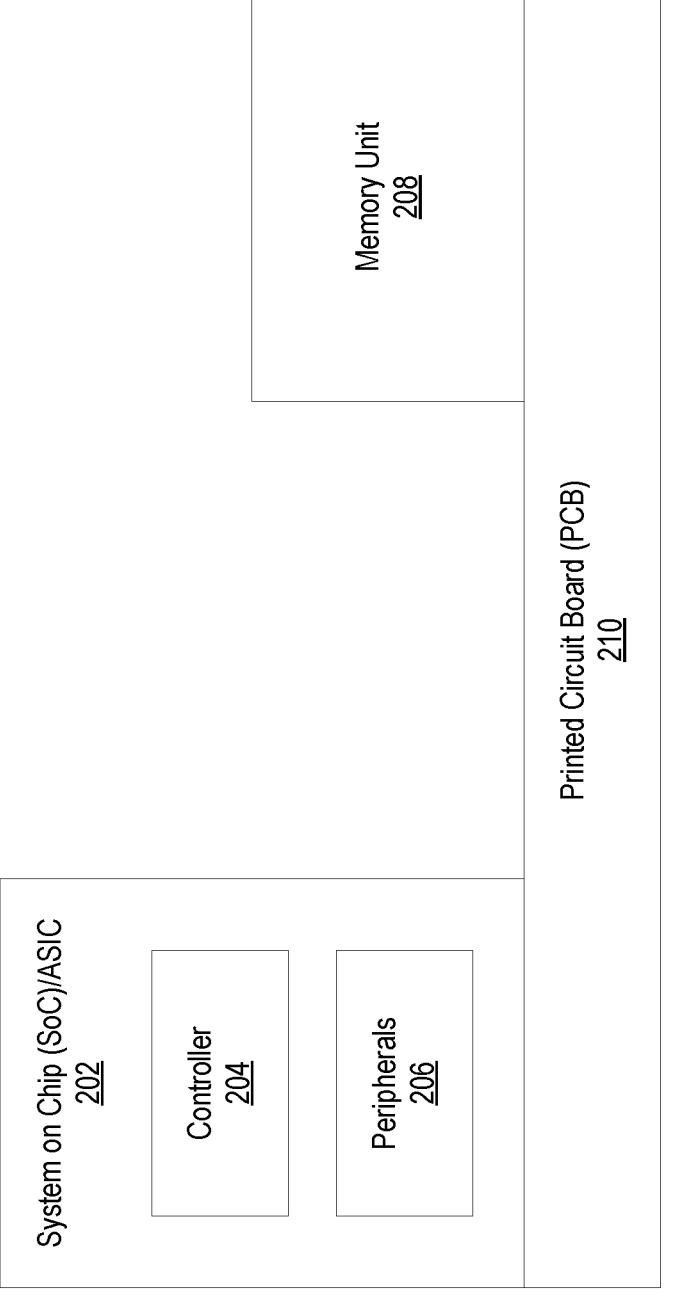
FIG. 2 is a schematic block diagram illustrating a SSD, according to certain embodiments.

FIG. 2 is a schematic block diagram illustrating a SSD 200, according to certain embodiments. The SSD 200 comprises a System on chip (SOC)/ASIC 202, a memory unit 208, and a printed circuit board (PCB) 210. The SOC/ASIC 202 comprises a controller 204 and peripherals 206. The SOC/ASIC 202 and the memory unit 208 are both disposed on the PCB 208. Both the memory unit 208, or memory device and SOC/ASIC 202 can get heated up, and as discussed below with regards to FIG. 3, both SOC/ASIC 202 and memory unit 208 temperatures are considered to handle the thermal throttling. Stated another way, any part of the system can be heated up within the storage device, not just the memory unit 208. In operation, when storage device moving to shutdown mode, then both SOC/ASIC 202 and the memory unit 208 are shutting down. Thus, the controller, which is shown as part of the SOC/ASIC 202, cannot function on its own. In this situation, only the host device can power-on the storage device. When the storage device is powered on then both SOC/ASIC 202 and memory unit 208 would be powered on.

Figure 3:
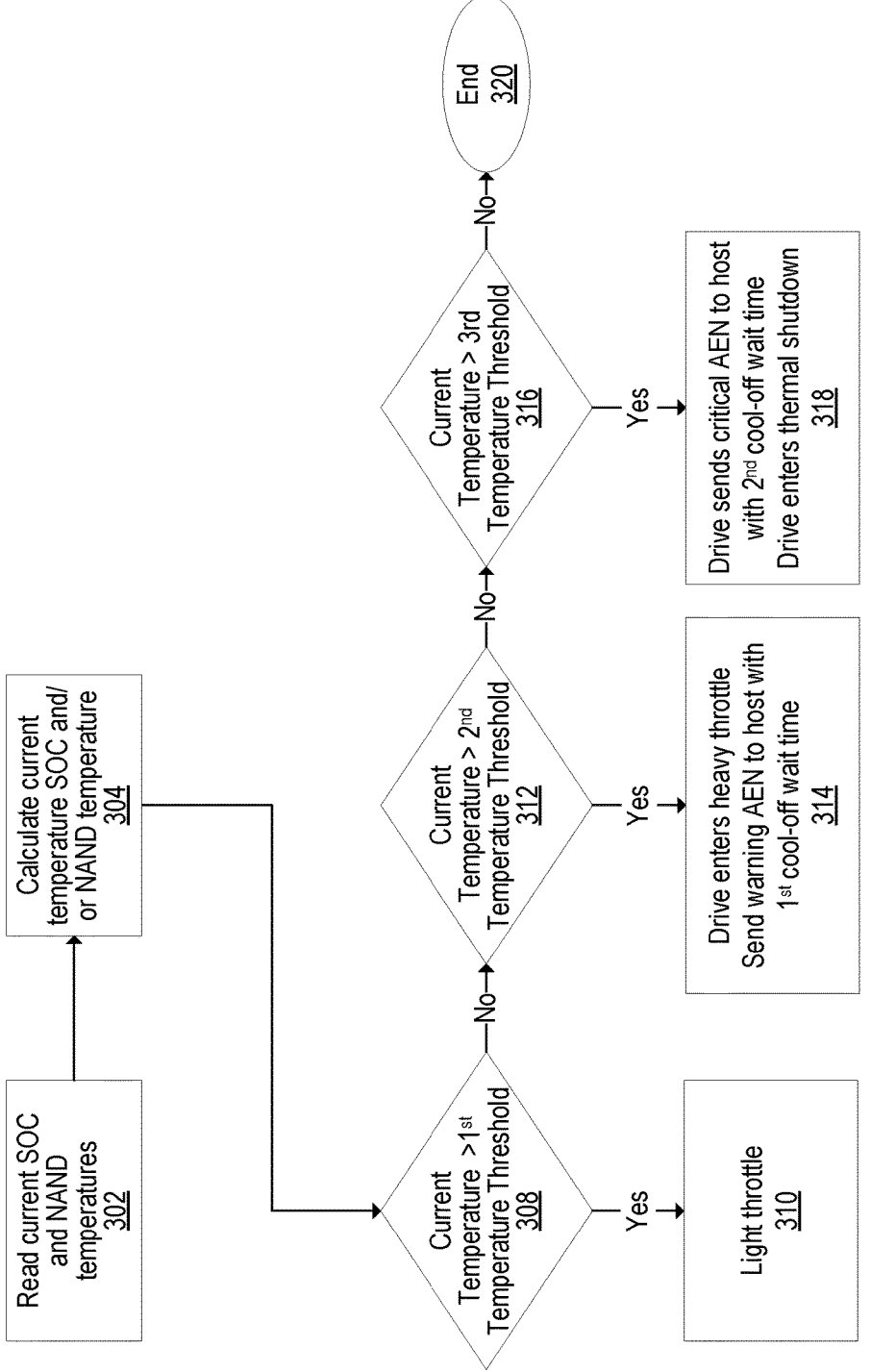
FIG. 3 is a flow chart illustrating a method for proposed flow at a SSD side, according to certain embodiments.

FIG. 3 is a flow chart illustrating a method 300 for proposed flow at a SSD side, according to certain embodiments. In the previous approach when input/output (I/O) operations are in progress, the NAND flash device gets heated. To avoid damaging the components, the SSD firmware will throttle flash activity when the measured PCB/SOC/NAND temperature reaches firmware (FW) defined and adjustable temperature threshold values. PCB/SOC/NAND temperatures will be polled in a periodic finite interval and FW will make decisions regarding flash activity (device performance) at every polling interval. SSD FW is generally designed to perform light throttle, heavy throttle, and thermal shutdown based on the SSD temperature. The decision is based on either one or multiple temperature values received from PCB/SOC/NAND.

During heavy throttling, the SSD FW will send an Asynchronous Event (AEN) to the host driver with a warning message. If the drive temperature reaches the thermal shutdown range, then the device FW will send an AEN with critical message before shutting down the power rails. The warning and critical messages will contains, in any vendor specific fields or in other available fields, a cool-off waiting time for the user to consider before powering on the host system or device. A background dashboard utility running on the host device will receive the events and display a banner to the user about the thermal throttling warning event of critical event, including the cool-off wait time received from the data storage device. The cool-off wait time is expected to be specific to the manufacturer's device/model and the manufacturer will pre-configure the time based on the drive's internal characterization.

Method 300 begins at block 302. At block 302, the controller reads the current SOC temperature and memory device (e.g. NAND) temperature. At block 304, the controller calculates the current SOC temperature and NAND temperature. If the current temperature of both the SOC and memory device are below the 1$^{st}$ temperature threshold, then the data storage device will operate at normal input/output (I/O) operation. I/O operations are read and write operations. At block 308, the controller determines if the current temperature is greater than a first temperature threshold. It is to be understood that the current temperature at block 308 refers to both the SOC temperature and the NAND temperature and hence if either the SOC or the NAND is greater than the 1$^{st}$ temperature threshold, then action will be taken to utilize the maximum temperature for throttling.

If the controller determines that the current temperature is greater than the first temperature threshold then method 300 proceeds to 312 to see if the current temperature may be greater than any higher temperature thresholds. If the controller determines that the temperature is only over the first temperature threshold, but below other thresholds, then method 300 proceeds to 310. At block 310, the controller will operate using light throttle. Throttle manages the temperature by reducing the SSD internal clock. During light throttle the host is informed so that the host can reduce the work asked for the SSD to perform. During light throttle the performance for the system may be at about 50% of maximum performance.

At block 312, the controller determines whether the current temperature is greater than a second threshold temperature. If the controller determines that the current temperature is greater than the second temperature threshold, then the method proceeds to 316 to see if the current temperature may be greater than any higher temperature thresholds. If the controller determines that the temperature is only over the second temperature threshold, but below other thresholds then method 300 proceeds to 314. At block 314, the SSD enters heavy throttle mode. During heavy throttle the performance for the system may be at about 25% of maximum performance. At block 314, the controller will also send a warning AEN to the host with a first cool-off wait time. The cool off wait time will be a pre-determined value.

At block 316, the controller determines whether the current temperature is greater than a third temperature threshold. If the controller determines that the current temperature is not greater than the third threshold temperature then method 300 proceeds to block 320. If the controller determines that the current temperature is greater than the third threshold temperature then method 300 proceeds to block 318. At block 318, the SSD sends a critical AEN to the host along with a second cool-off wait time. The cool-off wait time will be predetermined time and will be longer than the first cool-off wait time of that of block 314. Also at block 318, the SSD will enter a thermal shutdown. The thermal shutdown is initiated by the PMIC, which will disconnect the power to the device once a very high temperature is reached. At block 320, method 300 is completed.

Figure 4:
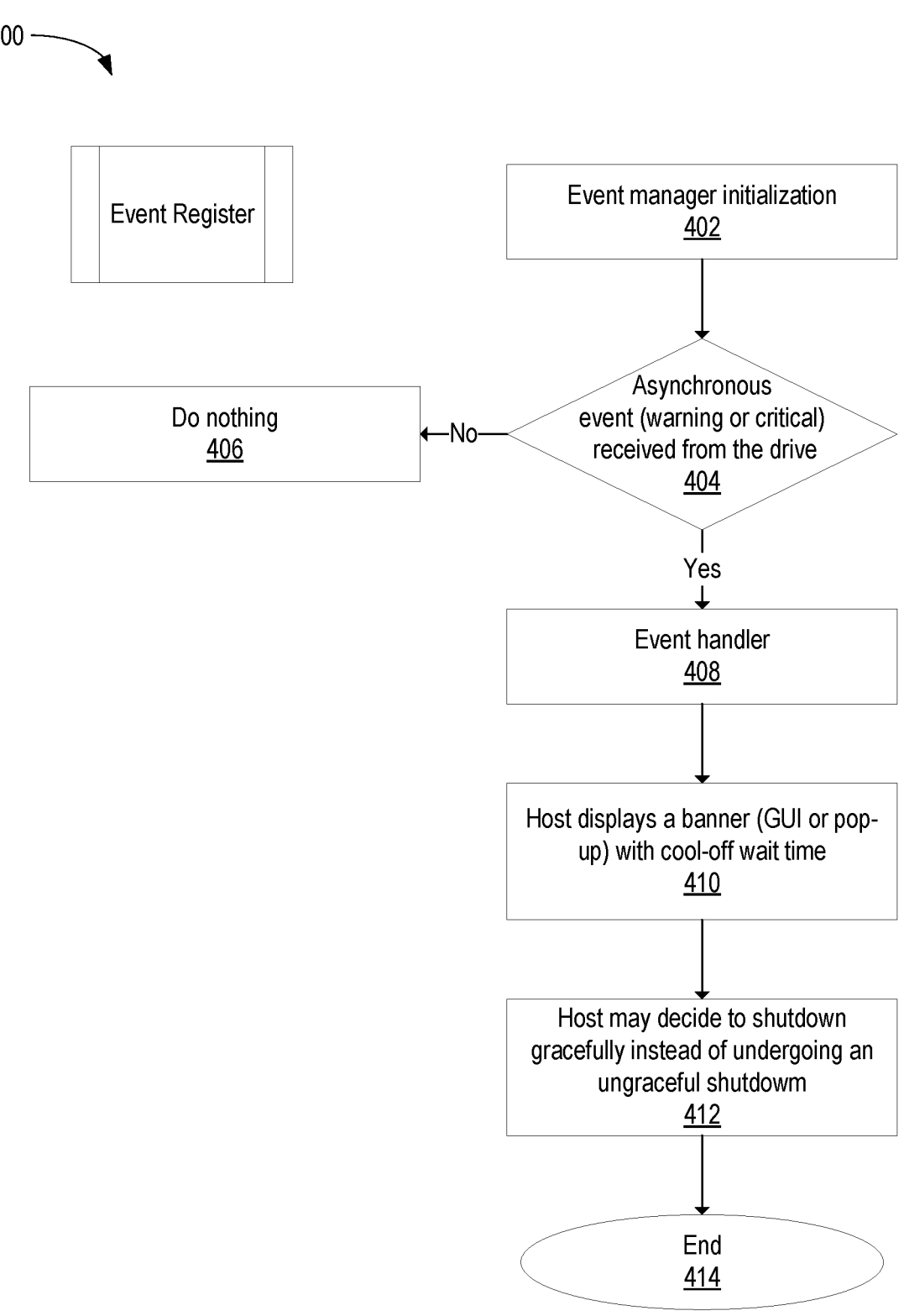
FIG. 4 is a flow chart illustrating a method for proposed flow at host side, according to certain embodiments.

FIG. 4 is a flow chart illustrating a method 400 for proposed flow at host side, according to certain embodiments. The host system is expected to shut down because the SSD under subject is used as primary boot drive. Before the SSD and host are shut down the user will be notified with a wait time using a banner.

Method 400 begins at block 402. At block 402, the host initializes the event manger. At block 404, the host determines whether the asynchronous events (AEN) received from the data storage device are warnings or critical. If the host determines the AEN to not to be of a warning or critical then method 400 proceeds to block 406. At block 406 the host does nothing. If the host determines the AEN to be of a warning or critical then method 400 proceeds to block 408. At block 408, the host uses an event handler. At block 410, the host displays a banner (GUI or pop-up) with a cool-off wait time. A background dashboard utility running on the host will receive the AEN and display the banner to the user about the thermal throttling warning event or critical event. The cool-off wait time is expected to be specific to a manufacture's device/model, and manufacture will pre-configure the time based on SSD's internal characterization. Once the cool-off wait time is issued then method 400 proceeds to block 412. At block 412, the host may decide to shutdown gracefully instead of undergoing an ungraceful shutdown. At block 414 method 400 is completed.

Figure 5:
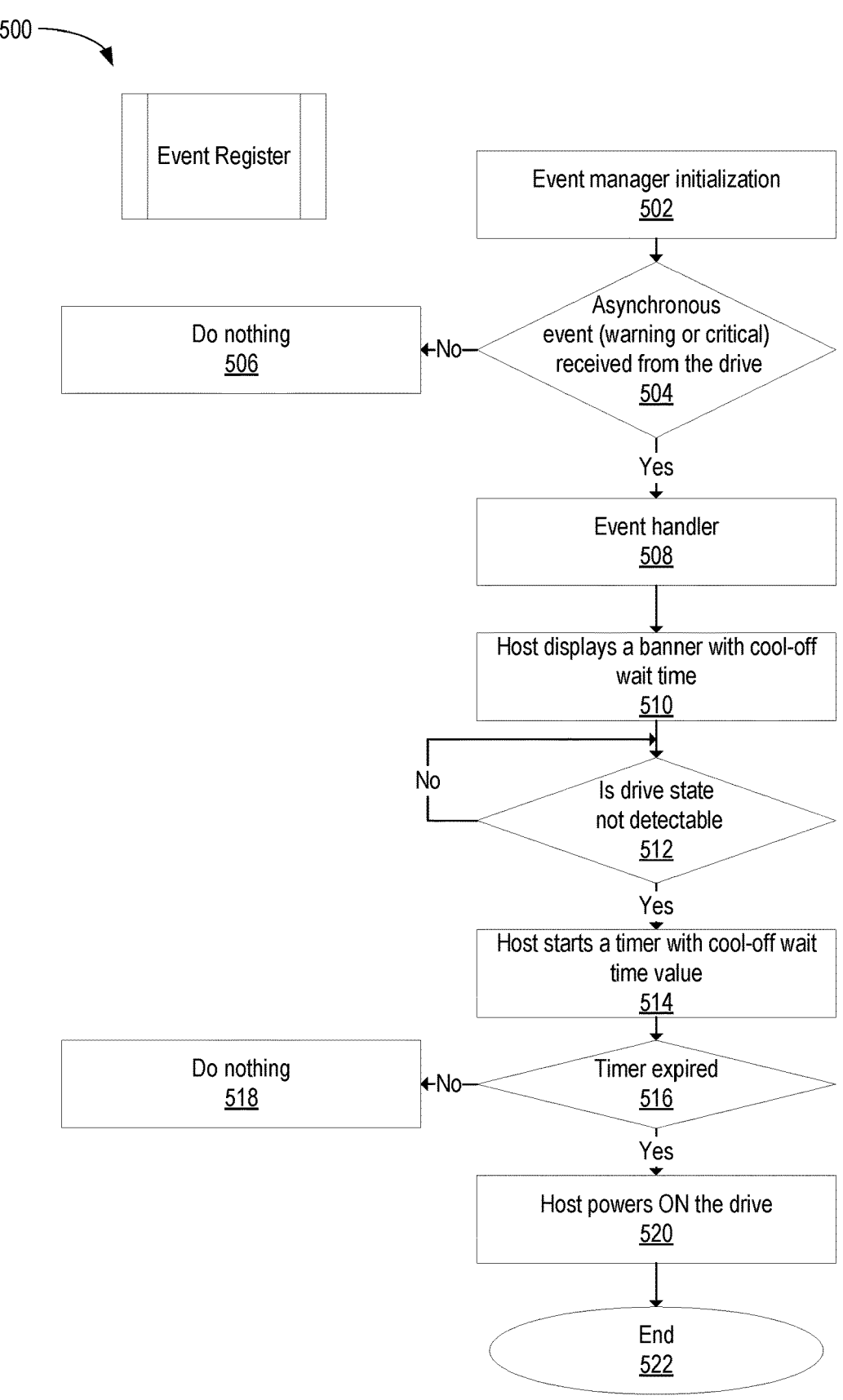
FIG. 5 is a flow chart illustrating a method for proposed flow at host side, according to certain embodiments.

FIG. 5 is a flow chart illustrating a method 500 for proposed flow at host side, according to certain embodiments. In particular, a situation where the host system is not expected to shutdown because the SSD is not the primary boot drive. When the SSD critical event message is received from the SSD, an event handler running on host will start an internal timer with a cool-off wait time value. The cool-off wait time is received from the SSD during heavy throttling phase or shutdown phase, and host would power-up the SSD once the timer is expired.

Method 500 begins at block 502. At block 502, the host device initializes the event manger. At block 504, the host device determines whether the AEN received from the SSD is either a warning event or a critical event. If the host device determines the AEN to not to be of a warning event or critical event then method 500 proceeds to block 506. At block 506, the host device does nothing. If the host device determines the AEN to be of a warning event or critical event then method 500 proceeds to block 508. At block 508, the host device uses an event handler. At block 510, the host device displays a banner with a cool-off wait time. Once the cool-off wait time is displayed then method 500 proceeds to block 512. At block 512, the host device determines whether the SSD state is detectable. If the host device determines the drive state to not be detectable then method 500 returns to block 510. If the host device determines the drive state to be undetectable or unresponsive then method 500 proceeds to block 514. At block 514, the host device starts a timer with the cool-off wait time value. At block 516, the host device determines whether the timer has expired. If the host device determines that timer has not expired then method 500 proceeds to block 518 to do nothing. If the host device determines that the timer has expired then method 500 proceeds to block 520. At block 520, the host device powers on the SSD and method 500 ends at block 522.

Figure 6:
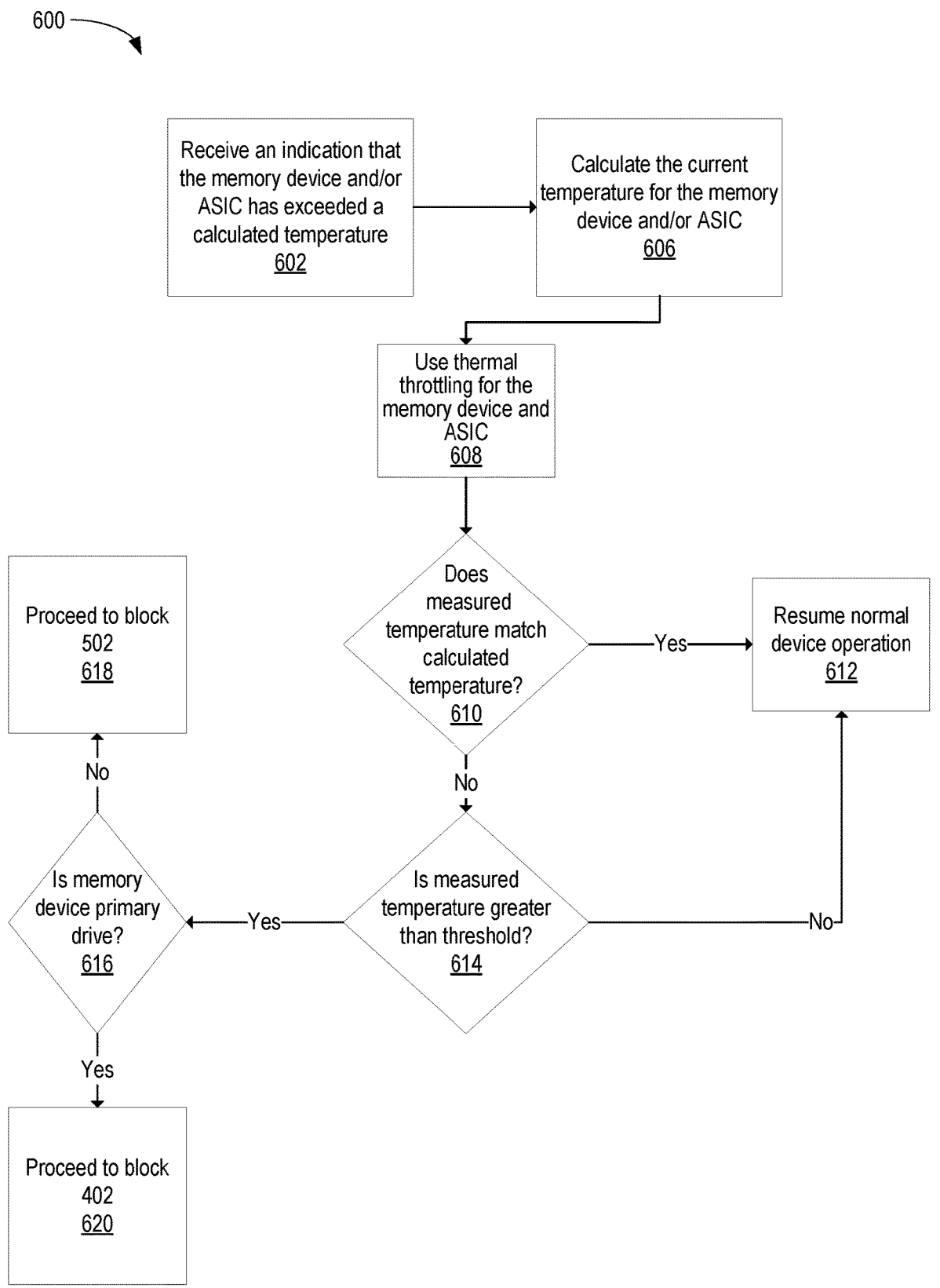
FIG. 6 is a flow chart illustrating a method for proposed flow for wait time notifications, according to certain embodiments.

FIG. 6 is a flow chart illustrating a method 600 for proposed wait time notifications, according to certain embodiments. Method 600 begins at block 602. At block 602, the controller such as the controller 204 of FIG. 2 receives an indication that either the memory device or ASIC has exceeded a calculated temperature. At block 604, the controller determines whether the memory device or the ASIC has exceeded the calculated temperature. If the controller determines that the memory device has exceeded the calculated temperature then method 600 will proceed to block 608. If the controller determines that the ASIC has exceeded the calculated temperature then method 600 will proceed to block 606. At block 606, the controller such as the controller 204 of FIG. 2 calculates the current temperature for the memory unit such as the memory unit 208 of FIG. 2 and SOC/ASIC such as the SOC/ASIC 206 of FIG. 2. Both the memory unit 208 and SOC/ASIC 202 temperature are checked separately to be able to use the maximum temperature between the memory unit 208 and SOC/ASIC 202 for throttling purposes. At block 608, temperature throttling begins on the memory unit and the SOC/ASIC using the maximum temperature. At block 610, the controller determines if the measured temperature matches the calculated temperature. If the controller determines the measured temperature does not match the calculated temperature then method 600 proceeds to block 614. If the controller determines the measured temperature does match the calculated temperature then method 600 proceeds to block 612. At block 612, the SSD resumes normal operations.

At block 614, the controller determines whether the measure temperature is greater than the threshold. If the controller determines the measured temperature is not greater than the threshold then method 600 returns to block 612. If the controller determines that the measured temperature is greater than the threshold then method 600 proceeds to block 616. At block 616, the controller determines whether the memory device is a primary drive. If the host determines the memory device is the primary drive then method 600 proceeds to block 620. If the host determines the memory device is not the primary drive then method 600 proceeds to block 618. At block 618, proceed to block 502. At block 620, proceed to block 402.

By using the cool-off wait notification the host will reboot the drive, when used as a secondary drive, on its own once the drive has cooled off sufficiently. The user/host can expect full SSD performance when the SSD is rebooted. Without the cool-off wait notification, the user/host is not sure when to reboot the drive and expect full performance. If the user reboots the drive manually without the cool-off wait time notification, possibly the drive has not still cooled-off and thereby again enter into thermal throttling stages (low performance stages). The cool-off wait time notification will improve quality of service (QOS) of the data center service providers.

In one embodiment, a data storage device comprises: a memory device; and a controller coupled to the memory device, wherein the controller is configured to: receive an indication that a temperature of the memory device has exceeded a temperature threshold; send a first asynchronous event notification (AEN) warning to a host device; and send a first cool-off wait time indication to the host device. The controller is configured to throttle usage of the memory device in response to the receiving the indication of the memory device exceeding a temperature threshold. The controller is configured to shut down the memory device after exceeding a highest temperature threshold. The controller is configured to send a second AEN warning to the host device. The controller is configured to send a second cool-off wait time indication to the host device. The second cool-off time is longer than the first cool-off time. The controller is configured to cause the memory device to enter thermal shutdown. The cool-off wait time is not calculated in response to the temperature exceeding the temperature threshold.

In another embodiment, a data storage device comprises: a memory device; and a controller coupled to the memory device, wherein the controller is configured to: receive an indication that the memory device has exceeded a temperature threshold; cause a cool-off notification to be issued; shut down memory device for a predetermined period of time; and power on the memory device after the predetermined period of time once a host is triggered. The predetermined period of time is a fixed time equal to an amount of time to permit the memory device to cool to a temperature below the temperature threshold. The controller is configured to send an asynchronous event notification (AEN) warning to the host. The AEN contains a cool-off notification to be issued that comprises a cool-off notification to be displayed to a user. The cool-off notification includes an indication of the predetermined period of time. The controller is configured to receive a power on indication from the host after the predetermined period of time has expired. The controller is configured to throttle the memory device. An application specific integrated circuit (ASIC) coupled to the memory device. A printed circuit board coupled to the ASIC and the controller.

In another embodiment, a data storage device comprises: means to store data; and a controller coupled to the means to store data, wherein the controller is configured to: receive an indication that the means to store data has exceeded a temperature threshold; and either: cause a message to be displayed indicating a cool-off time for the means to store data; or send a message to a host device indicating the cool-off time for the means to store data. The controller is further configured to controller is configured to send an asynchronous event notification (AEN) warning to the host indicating the data storage device needs to cool down. The controller is not operational during the cool-off time.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:

a memory device; and a controller coupled to the memory device, wherein the controller is configured to:

receive an indication that a temperature of the memory device has exceeded a temperature threshold;

send a first asynchronous event notification (AEN) warning to a host device; and send a first cool-off wait time indication to the host device, wherein the controller is configured to send a second AEN warning to the host device, wherein the controller is configured to send a second cool-off wait time indication to the host device.

2. The data storage device of claim 1, wherein the controller is configured to throttle usage of the memory device in response to the receiving the indication of the memory device exceeding a temperature threshold.

3. The data storage device of claim 1, wherein the controller is configured to shut down the memory device after exceeding a highest temperature threshold.

4. The data storage device of claim 1, wherein the controller is configured to send a second AEN warning to the host device.

5. The data storage device of claim 1, wherein the second cool-off time is longer than the first cool-off time.

6. The data storage device of claim 5, wherein the controller is configured to cause the memory device to enter thermal shutdown.

7. The data storage device of claim 1, wherein the cool-off wait time is not calculated in response to the temperature exceeding the temperature threshold.

8. A data storage device, comprising:
a memory device; and
a controller coupled to the memory device, wherein the controller is configured to:
    receive an indication that the memory device has exceeded a temperature threshold;
    cause a cool-off notification to be issued;
    shut down memory device for a predetermined period of time; and
    power on the memory device after the predetermined period of time upon receiving a power on indication from a host, wherein the predetermined period of time is a fixed time equal to an amount of time to permit the memory device to cool to a temperature below the temperature threshold.

9. The data storage device of claim 8, wherein the controller is configured to send an asynchronous event notification (AEN) warning to the host.

10. The data storage device of claim 9, wherein the AEN contains a cool-off notification that causes a cool-off notification to be displayed to a user.

11. The data storage device of claim 9, wherein the cool-off notification includes an indication of the predetermined period of time.

12. The data storage device of claim 8, wherein the controller is configured to receive a power on indication from the host after the predetermined period of time has expired.

13. The data storage device of claim 8, wherein the controller is configured to throttle the memory device.

14. The data storage device of claim 8, further comprising an application specific integrated circuit (ASIC) coupled to the memory device.

15. The data storage device of claim 14, further comprising a printed circuit board coupled to the ASIC and the memory device.

16. A data storage device, comprising:
means to store data; and
a controller coupled to the means to store data, wherein the controller is configured to:
    receive an indication that the means to store data has exceeded a temperature threshold;
    either:
        cause a message to be displayed indicating a cool-off time for the means to store data; or
        send a message to a host device indicating the cool-off time for the means to store data;
    shut down means to store data for a predetermined period of time; and
    power on the means to store data after the predetermined period of time upon receiving a power on indication from a host, wherein the predetermined period of time is a fixed time equal to an amount of time to permit the means to store data to cool to a temperature below the temperature threshold.

17. The data storage device of claim 16, wherein the controller is further configured to send an asynchronous event notification (AEN) warning to the host indicating the data storage device needs to cool down.

18. The data storage device of claim 17, wherein the controller is not operational during the cool-off time.

\* \* \* \* \*